US012757477B2

(12) United States Patent
Nöbauer et al.

(10) Patent No.: US 12,757,477 B2
(45) Date of Patent: Oct. 6, 2026

(54) SEMICONDUCTOR DIE WITH A VERTICAL DEVICE

(71) Applicant: Infineon Technologies Austria AG, Villach (AT)

(72) Inventors: Gerhard Thomas Nöbauer, Villach (AT); Alessandro Ferrara, Villach (AT); Sergey Yuferev, Villach (AT); Florian Gasser, Klagenfurt am Wörthersee (AT)

(73) Assignee: Infineon Technologies Austria AG, Villach (AT)

( * ) Notice: Subject to any disclaimer, the term of this patent is extended or adjusted under 35 U.S.C. 154(b) by 370 days.

(21) Appl. No.: 18/603,270

(22) Filed: Mar. 13, 2024

(65) Prior Publication Data

US 2024/0313105 A1 Sep. 19, 2024

(30) Foreign Application Priority Data

Mar. 14, 2023 (EP) .................................... 23161807

(51) Int. Cl.

| | |
|---|---|
| ***H10D 84/00*** | (2025.01) |
| ***H10D 30/01*** | (2025.01) |
| ***H10D 62/13*** | (2025.01) |
| ***H10W 10/00*** | (2026.01) |
| ***H10W 10/17*** | (2026.01) |
| ***H10W 20/43*** | (2026.01) |

(52) U.S. Cl.

CPC ....... *H10D 84/143* (2025.01); *H10D 30/0291* (2025.01); *H10D 62/157* (2025.01); *H10W 10/014* (2026.01); *H10W 10/17* (2026.01); *H10W 20/43* (2026.01)

(58) Field of Classification Search

CPC ............. H10D 84/143; H10D 30/0291; H10D 62/157; H10D 30/668; H10D 64/2527; H10D 84/141; H10D 84/148; H10D 84/811; H10W 10/014; H10W 10/17; H10W 20/43

See application file for complete search history.

(56) References Cited

U.S. PATENT DOCUMENTS

2013/0336033 A1* 12/2013 Hirler .................. H10D 30/665 363/124
2018/0138169 A1* 5/2018 Reiter .................. H10D 64/231
(Continued)

FOREIGN PATENT DOCUMENTS

| | | | |
|---|---|---|---|
| DE | 102017108048 | A1 | 10/2018 |
| DE | 102019125676 | B3 | 1/2021 |
| EP | 3435420 | A1 | 1/2019 |

*Primary Examiner* — Karen Kusumakar
(74) *Attorney, Agent, or Firm* — Murphy, Bilak & Homiller, PLLC

(57) ABSTRACT

The disclosure relates to a semiconductor die with a semiconductor body. The semiconductor die includes a vertical transistor device formed in a first area of the semiconductor body. The vertical transistor device includes a source region at a first side of the semiconductor body and a drain region at a second side of the semiconductor body. The semiconductor die further includes a first electrical isolation between the first area and a second area of the semiconductor body, and a diode in the second area of the semiconductor body. A cathode contact of the diode is electrically connected to the source region of the vertical transistor device.

20 Claims, 9 Drawing Sheets

(56) References Cited

U.S. PATENT DOCUMENTS

| | | | | |
|---|---|---|---|---|
| 2021/0175329 | A1* | 6/2021 | Sandow | H10D 12/481 |
| 2023/0069188 | A1* | 3/2023 | Shoji | G01R 31/2644 |
| 2023/0299077 | A1* | 9/2023 | Muramatsu | H10D 8/422<br>257/140 |

* cited by examiner

SEMICONDUCTOR DIE WITH A VERTICAL DEVICE

TECHNICAL FIELD

The present application relates to a semiconductor die comprising a vertical transistor device.

BACKGROUND

A source region of the vertical transistor device is disposed on a first side of a semiconductor body and its drain region is disposed vertically opposite on a second side of the semiconductor body. A gate electrode for controlling a current flow between the source and the drain region can particularly be arranged in a gate trench which extends from the first side into the semiconductor body.

SUMMARY

It is an object of the present application to provide an advantageous semiconductor die with a vertical transistor device, as well as a method of manufacturing the same.

In addition to the transistor device, the semiconductor die comprises a first electrical isolation between a first area in which the vertical device is disposed and a second area of the semiconductor body. In the second area, a diode is disposed, wherein a cathode contact of the diode is connected to the source region of the vertical device. In comparison to a so-called body diode, this diode is connected the other way around, its cathode contact connected to the source domain of the device. The diode can for instance provide an alternative current path, e.g. from a supply voltage to ground during a switching event. The transistor can for instance be used or connected as a high-side switch, e.g. in a step-down converter, and the integrated diode can reduce the loop inductance, e.g. the equivalent length of the current loop.

In general words, an approach of this application is to combine a transistor and a diode in the same die, wherein the cathode contact of the diode is connected to the source of the transistor. For the integration, the transistor and the diode can be arranged in different areas of the die, wherein these areas can particularly be electrically isolated from each other. Particular embodiments and features are provided throughout this disclosure. Therein, the individual features shall be disclosed independently of a specific claim category, the disclosure relates to apparatus and device aspects, but also to method and use aspects. If for instance a die manufactured in a specific way is described, this is also a disclosure of a respective manufacturing process, and vice versa.

In the intended use, the first electrical isolation between the first and the second area of the semiconductor body can for instance isolate a ground potential from an input potential. In general words, it can allow for applying at least two different electrical potentials to the first side and/or the second side of the semiconductor body. Generally, the electrical isolation can for instance be a junction isolation or a deep trench isolation. For the deep trench isolation, an insulating filler can be arranged in the deep trench, which electrically isolates the first and the second area of the semiconductor body from each other. Seen in a vertical top view, the deep trench can in particular form a closed line, e.g. surround the second area completely. In other words, the second area can be embedded laterally into the first area of the semiconductor body.

The semiconductor body can comprise a semiconductor substrate and for instance one or several epitaxial layers on the substrate. In an epitaxial layer or layers, for instance the source region and/or a body region and/or a drift region of the vertical device can be arranged. The deep trench can in particular extend down into the semiconductor substrate, e.g. intersect it completely when viewed in a vertical cross-section. In general words, the deep trench can reach vertically from the first side of the semiconductor body to the vertically opposite second side thereof. In addition to the insulating material filler, another filler can be arranged in the trench, see the exemplary embodiments for illustration.

Source and drain of the vertical transistor are arranged at vertically opposite sides of the semiconductor body. A gate region of the device can capacitively couple to a body region made of an opposite doping type to form a channel in the body region. In particular, the gate region can be arranged in a trench extending from the first side into the semiconductor body, a vertical channel formed laterally aside the trench.

"Vertical" or "vertically" refers to the vertical direction which lies for instance perpendicular to a surface of the die, e.g. a surface of the semiconductor body. The first and second side of the semiconductor body lie vertically opposite. "Above" means vertically aligned and closer to the first side of the semiconductor body or frontside of the die, "below" means vertically aligned and closer to the second side of the semiconductor body or the backside of the die. An "upper" portion is closer to the first side than a "lower portion". "Lateral" or "laterally" refers to the lateral directions perpendicular to the vertical direction, in which for instance the different areas of the semiconductor body are arranged aside each other.

In general, the diode can be formed laterally between a respective p- and n-region, e.g. at the first side of the semiconductor body, with a lateral current path through the diode. In particular, however, the diode is formed between two portions of the semiconductor body which are arranged vertically one above the other. In other words, a current path can in particular extend vertically through the diode. With the vertical diode, the thickness of the semiconductor body can for instance be used for increasing the blocking voltage, the vertical diode having in particular the same or similar (e.g., 20% higher or 20% lower) blocking voltage as the vertical device in the first area of the die.

In an embodiment, a first doping region which forms an anode contact of the diode is arranged at the first side of the semiconductor body. The diode is formed between the first doping region and a lower portion of the semiconductor body below the first doping region. The lower portion of the semiconductor body in the second area can in particular lie on the same vertical height as a drift region of the vertical device in the first area. The lower portion can particularly have the same doping type and the same or similar (e.g., 20% higher or lower doping levels) profile as the drift region of the vertical device. In general words, the first doping region and the lower portion of the semiconductor body have an opposite doping type, the first doping region being in particular p-doped and the lower portion n-doped, e.g. n-doped with a lower concentration compared to an n-doped drain region of the vertical device.

A second doping region arranged in the second area on the first side of the semiconductor can form the cathode contact of the diode, e.g. be electrically connected to the source region of the vertical device. The second doping region is of the same doping type as the lower portion of semiconductor body, but it can for instance have a higher doping concentration compared thereto. The second doping region can in particular be n-doped, whereas the first doping region is p-doped. Viewed as a whole, a current path through the diode can extend down and upwards in the semiconductor body, e.g. basically have a U-shape between the first and the second doping region.

In an embodiment, the electrical connection between the second doping region and the source region of the vertical device is formed by a first metal pad. The first metal pad is arranged on the first side of the semiconductor body and extends laterally across the first electrical isolation, bridging for instance the deep trench isolation. In case that more than one metallization layer is arranged on the first side of the semiconductor body, the first metal pad can be formed in the lowermost metallization layer, in an intermediate and/or in particular in an uppermost metallization layer. The metal pad can for instance be formed in a copper layer, in particular in a top copper layer.

In an embodiment, a low-doped region is arranged laterally between the first and the second doping region in this area of the semiconductor body. It can for instance have the same doping type but a lower doping concentration compared to the second doping region, e.g. be low n-doped. The low-doped region can for instance be of the same doping type and the same or similar (e.g., 20% higher or lower doping levels) profile as the drift region of the vertical device.

In an embodiment, a high-doped region is disposed below the first and/or second doping region in the second area, it can in particular be an n-doped region. The high-doped region is for instance disposed on the second side of the semiconductor body. Compared to the low-doped region discussed above, it can be of the same doping type but have a higher doping concentration. Vertically between the first doping region and the high-doped region, the lower portion of the semiconductor body can be arranged. The second doping region can for instance extend deeper into the semiconductor body than the first doping region, in particular it can extend down to the high-doped region, e.g., be in a direct electrical contact therewith.

As mentioned above, a current path through the diode can have a U-shape between the first and the second doping region, namely have a downward and an upward portion (one through diode and the other one between the high-doped region and the second doping region), as well as a lateral portion in the high-doped region in between the downward and the upward portion. Independently of these details, the high-doped region can in particular be of the same doping type and the same or similar (e.g., 20% higher or lower doping levels) profile as the drain region of the vertical device, e.g. be manufactured in the same process step (reuse of existing process steps).

In an embodiment, a fourth metal pad is disposed on the second side in the second area of the semiconductor body. The fourth metal pad can for instance be formed in the same backside metallization layer such as a drain metallization. In general, this can be an alternative to the high-doped region, e.g. form a lateral portion of a U-shaped current path. In particular, the fourth metal pad can be combined with the high-doped region, namely be in electrical contact with the high-doped region. The fourth metal pad can for instance be floating, e.g. be not connected in the package.

In an embodiment, a second electrical isolation is disposed between the second area and a third area of the semiconductor body. Seen in a vertical cross-section, the second area or a portion of the second area can be enclosed laterally between the first and the second electrical isolation, the first area arranged on one lateral side thereof and the third area arranged on the other lateral side thereof. Seen in a vertical top view, the areas can be nested one in the other, the second area embedded into the first area, separated by the first electrical isolation which forms a closed line, and the third area embedded into the second area, separated by the second electrical isolation which forms a closed line. Like the first electrical isolation, the second electrical isolation can in particular be a deep trench isolation, the first and the second isolation can particularly be made in the same process steps.

In an embodiment, the anode contact, in particular the first doping region of the diode, which is arranged at the first side of the semiconductor body, is electrically connected to the second side in the third area of the semiconductor body. In other words, the contact is routed from the first side to the second side there. Likewise, the anode contact of the diode can be connected on the second side of the semiconductor body, e.g. from the backside of the die. There, a connection can be formed in the package, e.g. a ground connection. In still other words, the ground connection can be routed from the frontside to the backside in the third area of the semiconductor body.

In an embodiment, a second metal pad extends across the second electrical isolation at the first side of the semiconductor body. The second metal pad can in particular be formed in a lowermost metallization layer and/or in the same metallization layer as the first metal pad discussed above. The second metal pad extending across the second electrical isolation can connect the first doping region/anode contact in the second area and a third doping region at the first side in the third area of the semiconductor body. The third doping region can be of the same doping type as the second doping region, e.g. be n-doped. The second and third doping region can particularly be made simultaneously, e.g. in the same implantation step. They can for instance have the same depth and the same or similar (e.g., 20% higher or lower doping levels) doping profile. The third doping region can contact a high-doped region at the second side in the third area of the semiconductor body, which can in particular be of the same doping type and the same or similar (e.g., 20% higher or lower doping levels) profile as the drain region of the vertical device and/or the high doped region at the second side in the second area of the semiconductor body.

In an embodiment, a frontside metal layer covers a lower metallization layer in which the first and/or second metal pad is/are formed. The frontside metal layer can be thicker and/or made of another material than the lower metallization layer, e.g. be a frontside copper layer on a lower aluminum layer. Independently of these details, the second metal pad can for instance be electrically isolated from the frontside metal layer by an insulating layer vertically in between, in particular by an imide layer. In the first area of the semiconductor body, the insulating layer can be interrupted to form an electrical contact between the lower metallization layer and the frontside metal layer (source metallization), the frontside metal layer can in particular be in a direct contact to the lower metallization layer.

In an embodiment, a third metal pad is formed on the second side to contact the anode contact of the diode in the third area. In the package, the third metal pad can be connected to a ground contact, see the remarks above. According to one embodiment, the third metal pad can extend solely within the third area, e.g. within the boundary of the second electrical isolation. In an alternative embodiment, however, the third metal pad extends across the second electrical isolation into the second area. This can for instance increase an area available for contacting the third metal pad. The third metal pad extending into the second area can in particular be an alternative to the fourth metal pad discussed above. In the second area, the third metal pad can be electrically isolated from the semiconductor body by an insulating layer disposed on the second side of the semiconductor body, for instance silicon oxide.

The insulating layer can in particular be made of the same insulating material as an insulating filler of the deep trench isolation. The insulating filler can be deposited after the trench has been etched and cover at least the sidewalls of the deep trench. Process wise, the insulating layer on the second side can in general be a residuum of the trench fill process, which is for instance removed in the first area to allow for an electrical contact to the drain region, but can remain in the second area and serve as an electrical isolation between the semiconductor body and the third metal pad there. Alternatively, the insulating layer can be deposited in a separate process step, e.g. subsequent to the trench fill steps.

In an embodiment which can relate to a reuse of existing process steps as well, the first doping region is of the same doping type and the same or similar (e.g., 20% higher or lower doping levels) profile as the body region of the vertical device. The first doping region and the body region can in particular be made in the same implantation step. Alternatively or in addition, the first doping region can be arranged between trenches which are of the same type as gate trenches of the vertical device. In other words, the area where the first doping region is formed or is to be formed, and the active area with the vertical device can be processed simultaneously, e.g. as regards a trench etch and also trench fill, but for instance apart from a source doping applied to the active area and omitted in the area of the second doping region.

The application relates also to a semiconductor package comprising a semiconductor die disclosed here. In particular, an anode contact of the diode can be electrically connected to a ground contact of the package, e.g. by a respective ground clip or wire. The remaining backside apart from the third metal pad and/or fourth metal pad can particularly be on a common drain potential. The package can for instance be a chip embedded package and/or the die can be mounted with the second side up (flip chip).

The application relates also to a step-down converter (buck converter), namely a DC-to-DC converter stepping down the voltage from an input to an output. The transistor with which the diode is integrated in the same die can in particular be connected as a high side switch of the converter, the diode connected between the source contact of the high side switch and a ground domain of the converter. For that purpose, the die with the high side switch can have an additional pin, namely ground contact. This contact can be connected to a ground pin of a package. In addition, the converter comprises a low side switch connected between the source contact of the high side switch and the ground domain. In particular, the die with the low side switch can be arranged in the same package with the die comprising the high side switch, particularly both dies being connected to the same ground pin. In the converter, inductances between the voltage supply and the switches can occur, which can for instance result in switching losses or might even lead to an avalanche risk.

The diode monolithically integrated with the high side switch can reduce the inductance by providing an alternative current path between the supply voltage and the ground domain (reducing an equivalent length of the current loop). During switching, the low side switch only has diode properties (its gate is on source potential) so that the monolithically integrated diode on the high side has the same properties but a lower inductance due to the integration. The die with the vertical device and the diode act as a monolithically integrated half bridge during switching, whereas the transistor devices are separated in conduction mode (assuming separate dies for the high side and low side switch, which can be less complex than a fully integrated solution).

The application relates also to a method of manufacturing a die disclosed here. Regarding further processing details, in particular with respect to simultaneous process steps, reference is made to the description above.

BRIEF DESCRIPTION OF THE DRAWINGS

Below, the semiconductor die with the vertical transistor device and the diode are explained in further detail by means of exemplary embodiments. Therein, the individual features can also be relevant in a different combination.

DETAILED DESCRIPTION

Figure 1:
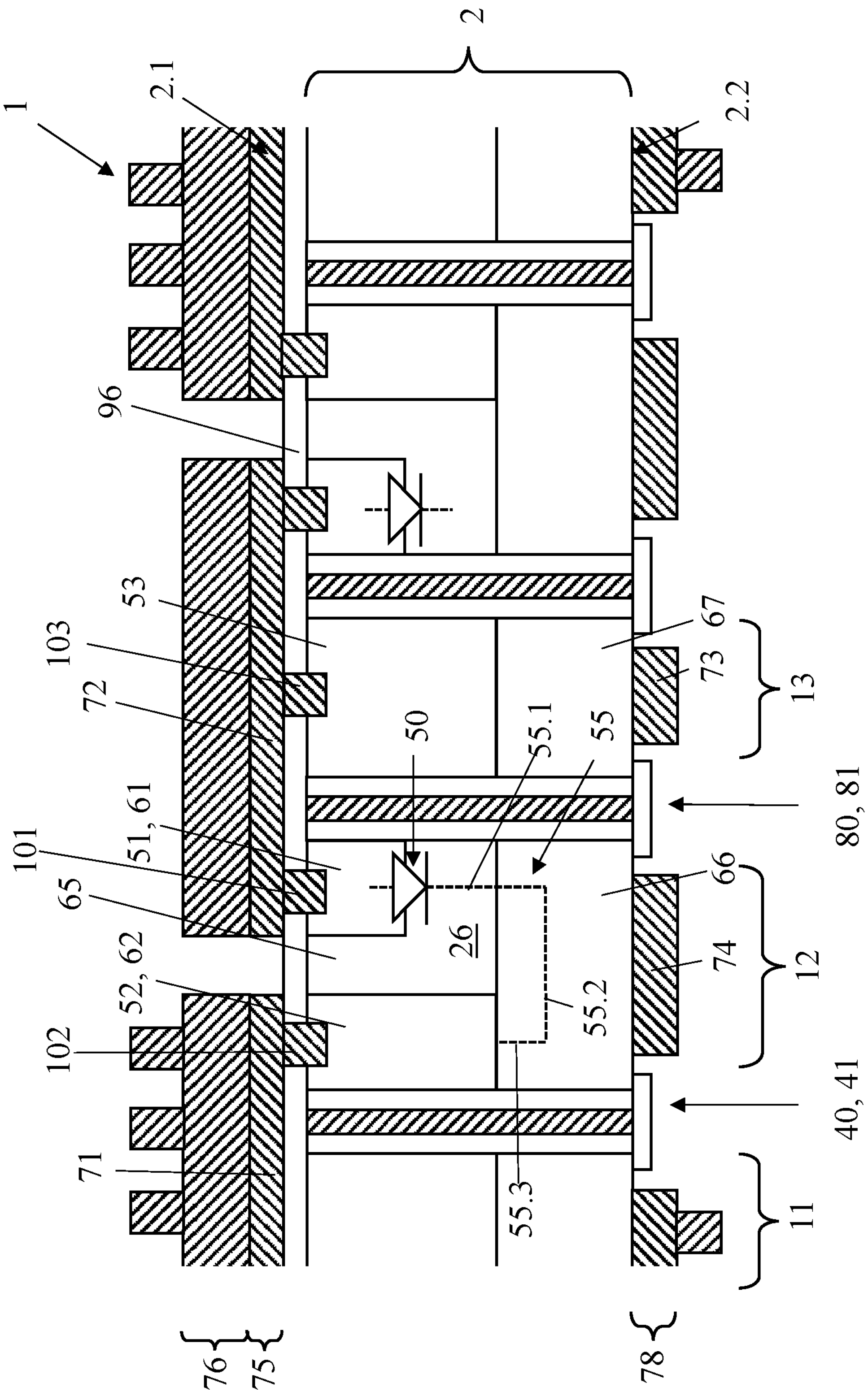
FIG. 1 shows a portion of a semiconductor die with an integrated diode.
Figure 2:
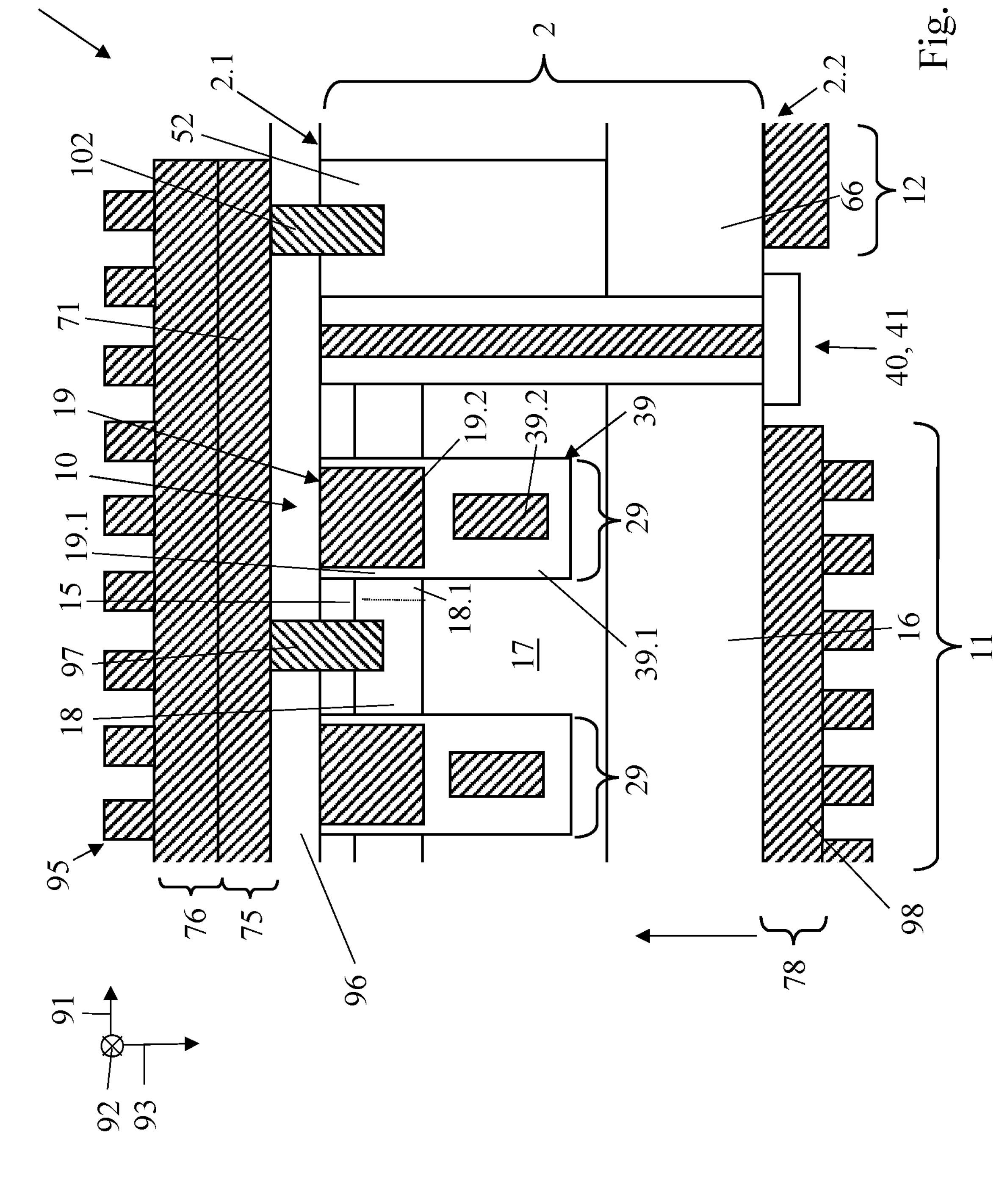
FIG. 2 shows another portion of the die and illustrates vertical transistor devices.

FIG. 1 shows a portion of a semiconductor die 1 in which a vertical transistor device, see FIG. 2 in details, and a diode 50 are combined. The vertical device is disposed in a first area 11 and the diode 50 is disposed in a second area 12 of a semiconductor body 2. The first and the second area 11, 12 are electrically isolated from each other by a first electrical isolation 40 which is a deep trench isolation 41 in the example shown. The diode 50 is formed between a first doping region 51, p-doped in this example, which is disposed at a first side 2.1 of the semiconductor body 2 and a lower portion 26. The lower portion 26 is a low-doped n-region. Both the first area 11 and the second area 12 may be made of monocrystalline semiconductor material (such as silicon or silicon carbide). For example, the first doping region 51, and lower portion 26 may comprise (e.g., be made of) monocrystalline semiconductor material (such as silicon). In some examples, first area 11 may be considered as being an active area (e.g., comprising active transistor cells, exemplarily shown in FIG. 2) and the second area 12 may be considered as a diode area (e.g., being devoid of active transistor cells).

A current path 55 through the diode 50 is shown schematically as a dashed line. It has a downward and an upward portion 55.1, 55.3 as well as a lateral portion 55.2 in between. The lateral portion 55.2 is disposed in a high-doped region 66, e.g. formed in the semiconductor substrate extending over the whole die, at the second side 2.2 in the third area 13. At the first side 2.1 of the semiconductor body 2 a second doping region 52 is disposed, which is an n-doped sinker implant that can reach deeper than the first doping region 51. The first and the second doping region 51, 52 are spaced via a low-doped region 65. The second doping region 52 is the cathode contact 62 of the diode 50. Via a first metal pad 71 formed in a (lower) metallization layer 75, the second doping region 52 and cathode contact 62 of the diode 50, thus, are connected to the source domain of the vertical device, see in detail below. For example, the second doping region 52, low-doped region 65, and high-doped region 66 may comprise (e.g., be made of) monocrystalline semiconductor material (such as silicon).

Semiconductor die 1 further comprises a second metal pad 72 that is electrically isolated from the first metal pad 71. Second metal pad 72 may be directly connected with the first doping region 51 (such as with anode contact 61 of diode 50). In some embodiments, second metal pad 72 can be contacted by an additional terminal (such as in addition to a source terminal that may be in contact with first metal pad 71). Via second metal pad 72 (that is electrically isolated from the first metal pad 71), an anode contact 61 of the diode 50, namely first doping region 51, may be electrically connected to a ground domain, e.g. in or via a third area 13 of the semiconductor body 2 to a third metal pad 73 on the second side 2.2. Between the second and the third area 12, 13, a second electrical isolation 80 is disposed, which is a deep trench isolation 81 as well. For connecting the second metal pad 72 on the first side 2.1 to the third metal pad 73, a third doping region 53, which can be a sinker implant like the second doping region 52 and be formed in the same implant step, is disposed in the third area 13 at the first side 2.1 of the semiconductor body 2. At the second side 2.2, another high-doped region 67 is arranged. The third area 13 (like the first area 11 and the second area 12) may be made of monocrystalline semiconductor material (such as silicon or silicon carbide). For example, doping region 53, and high-doped region 67 may comprise (e.g., be made of) monocrystalline semiconductor material (such as silicon). In some examples, the third area 13 may be considered as a through-via which may allow a current to flow from the first side 2.1 to the second side 2.2.

The third metal pad 73 can be formed in the same metallization layer 78 such as a fourth metal pad 74 in the second area 12 and a drain metallization of the vertical device, see below. In the example shown, the fourth metal pad 74 is floating, whereas the third metal pad 73 will be connected to a ground contact.

FIG. 2 shows another portion of the die 1, namely the first area 11 with the vertical transistor device 10. It comprises a source region 15 at the first side 2.1 and a drain region 16 at the second side 2.2 of the semiconductor body 2. The source and drain region 15, 16 are both n-doped, vertically in between a p-doped body region 18 is arranged. Laterally aside the body region 18, a gate region 19 is disposed in a gate trench 29 which extends from the first side 2.1 into the semiconductor body 2. The gate region 19 comprises a gate dielectric 19.1 and gate electrode 19.2 which capacitively couples to the body region 18 to form a channel region 18.1. Below the gate region 19 a field electrode region 39 is disposed in the trench 29, comprising a field dielectric 39.1 and a field electrode 39.2 which capacitively couples to the drift region 17. The drain region 16 is of the same doping type and the same or similar (e.g., 20% higher or lower doping levels) profile as the high-doped regions 66 and 67 in the second and third area 12, 13.

The sectional plane of FIG. 2 lies parallel to a first lateral direction 91 and to a vertical direction 93. In the first lateral direction 91, a plurality of respective device cells with trenches 29 are arranged aside each other in the first area 11. In a second lateral direction 92, the trenches 29 respectively have an elongated extension, forming a stripe pattern seen in a vertical top view. In general, however, the trenches can also have another lateral extension, e.g. be gate trenches in a grid pattern seen in a top view, for instance in combination with a respective needle-shaped field electrode centrally in the cells of the grid.

In the metallization layer 78, a drain metallization 98 is formed on the second side 2.2. On the first side 2.1, a source metallization 95 is formed in the lower metallization layer 75 and in the frontside metallization layer 76. In detail, an insulating layer 96 is disposed on the first side 2.1 and the electrical connection to the source metallization 95 is formed by a body and source contact 97 extending through the insulating layer 96. The insulating layer 96 extends also in the second area 12, where the electrical contact to the first metal pad 71 and source metallization 95, thus, is made by a second contact 102. The second metal pad 72 is connected to the first doping region 51 via a first contact 101 and to the third doping region 53 via a third contact 103. On the source metallization 95, and also on the drain metallization 98, vias for a contact formation in the package are disposed.

Figure 3:
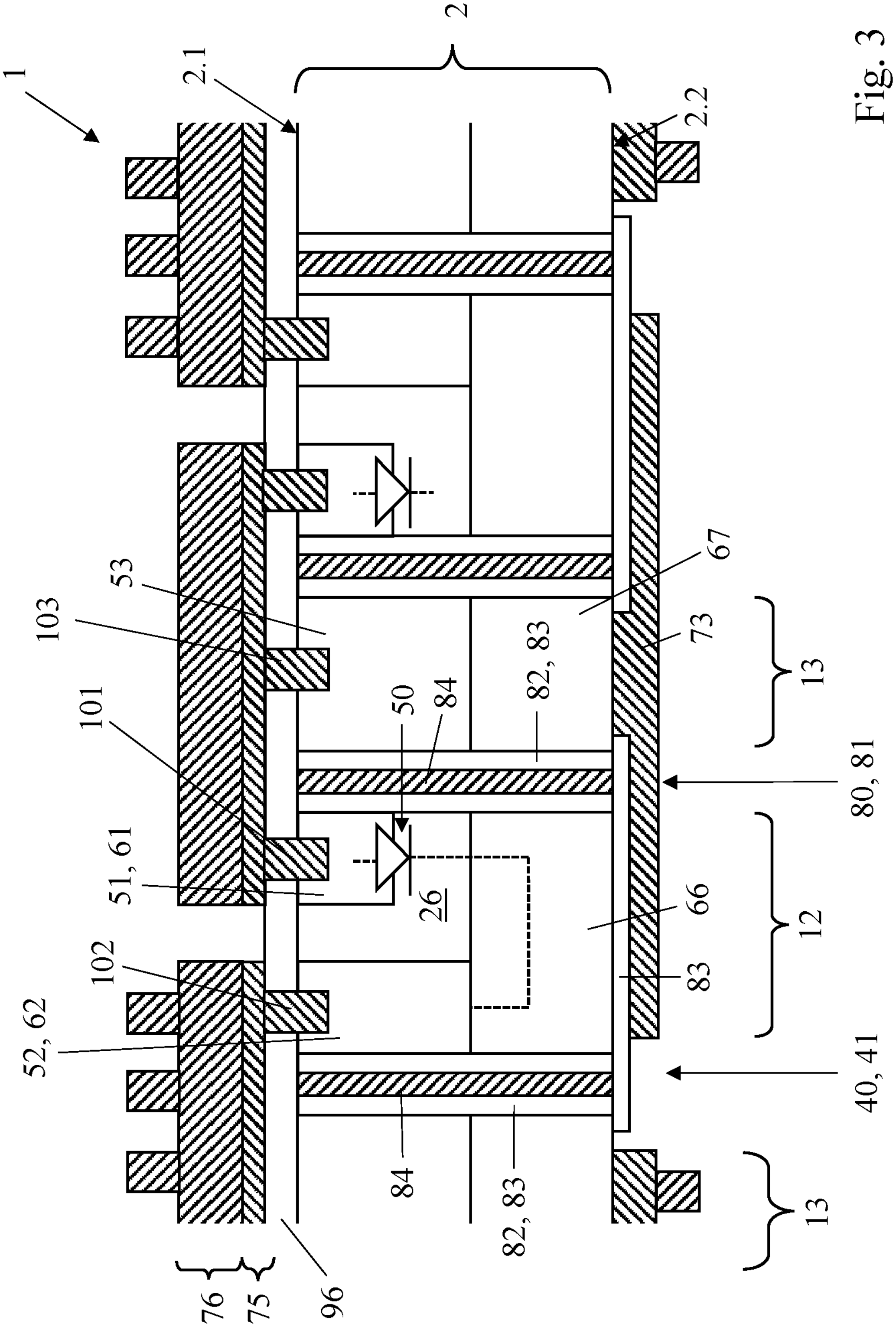
FIG. 3 shows a diode comparable to that of FIG. 1, with a different backside metallization.

FIG. 3 shows a view comparable to FIG. 1 and illustrates in particular the diode 50 and its wiring. Generally, in this disclosure, like reference numerals indicate like parts or parts with like function and reference is respectively made to the description of the other figures as well. The following description mainly highlights the differences between the embodiments of FIGS. 1 and 3, which concerns the metallization concept on the second side 2.2. The third metal pad 73 in FIG. 3 extends from the third area 13 across the second electrical isolation 80 into the second area 12. Vice versa, the floating metallization provided there in FIG. 1 (fourth metal pad 74) is omitted. The third metal pad 73 is electrically isolated from the second side 2.2 in the second area 12 of the semiconductor body 2 by an insulating material 83. The same insulating material 83 forms an insulating filler 82 of the deep trench isolation 81, which applies analogously for the deep trench isolation 41. In the example shown, the deep trench isolations 41, 42 additionally comprise a conductive filler 84 made of polysilicon and embedded into the insulating filler 83.

Figure 4:
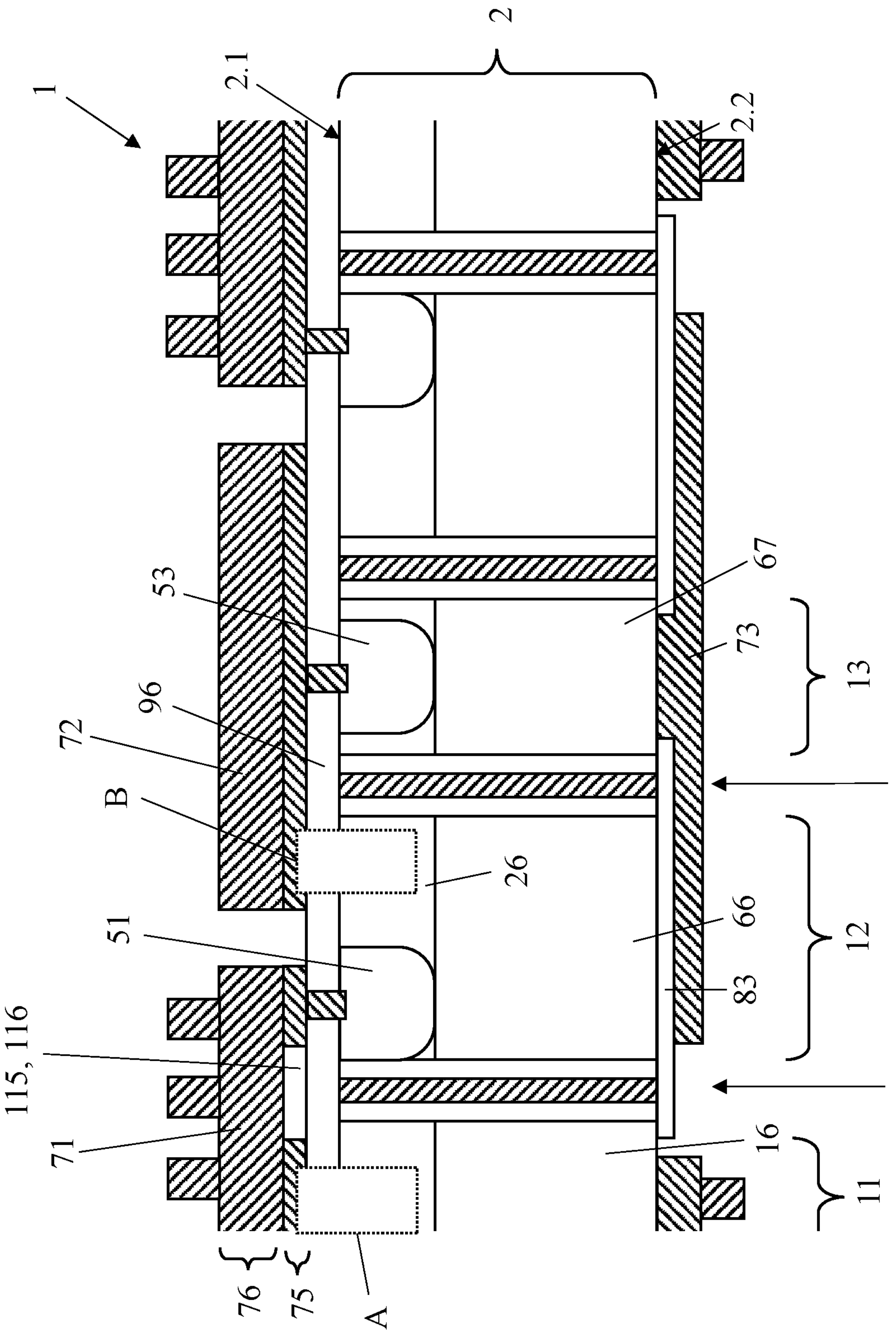
FIG. 4 shows a portion of a die and illustrates some additional details.

FIG. 4 shows an embodiment basically comparable to FIG. 3 as regards the metallization structure on the second side 2.2. The first metal pad 71 is solely formed in the frontside metallization layer 76, the lower metallization layer 75 is interrupted there by an insulating layer 115, in particular imide layer 116. Laterally, a respective copper bridge does not necessarily extend along the whole length of the deep trench, one or a plurality of copper bridges can be formed locally. Where the frontside metallization layer 76 is in contact with the lower metallization layer 75, the imide has been removed prior to the copper deposition.

Figure 5:
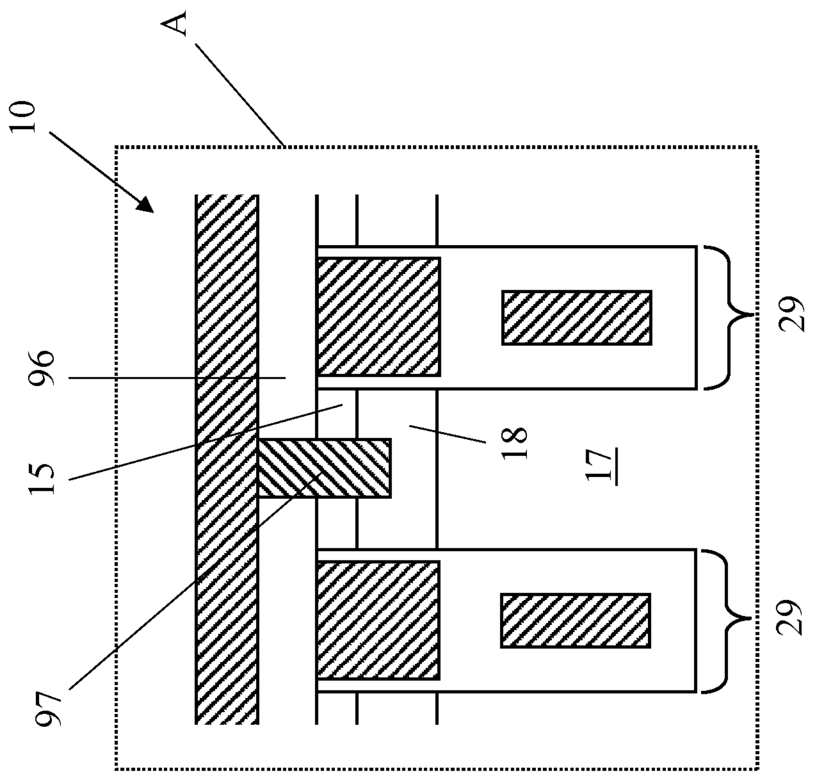
FIG. 5 shows a detailed view of vertical devices of the embodiment of FIG. 4.
Figure 6:
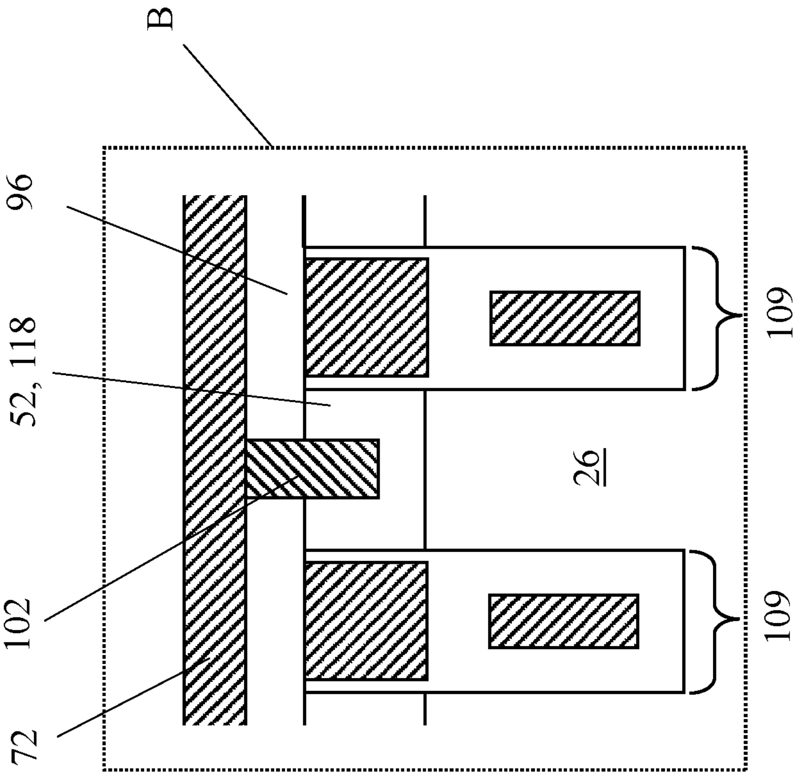
FIG. 6 shows a detailed view of the diode of the embodiment of FIG. 4.

In connection with FIGS. 5 and 6 showing detailed views of FIG. 4, in particular a specific setup of the first doping region 61 is illustrated. The first and the third doping region 51, 53 are respective sinker implants and the high-doped regions 66, 67 correspond to the drain region 16 in their doping type and profile.

Further details of the second doping region become apparent from a comparison of the detailed views A, B. The detailed view A in FIG. 5 illustrates a part of the vertical transistor device 10, namely the source region 15, the body region 18 and the drift region 17, as well as the gate trenches 29, see FIG. 2 for further details. The detailed view B shown in FIG. 6 is captured on the same vertical position but in the second area 12 instead. The second doping region 52 is made of a body implant 118 from which the body region 18 is formed in the same process step. In comparison to the active cell, the source doping is omitted. Alternatively, the source implant could be kept and the gate could be shorted to the source. The second contact 102 can be formed in the same process step as the body and source contact 97 of the transistor device 10. Like in the active cell, trenches 109 can be formed in the area of the diode, e.g. simultaneously with the gate trenches 29. The trenches 109 can for instance be filled like the gate trenches 29.

Figure 7:
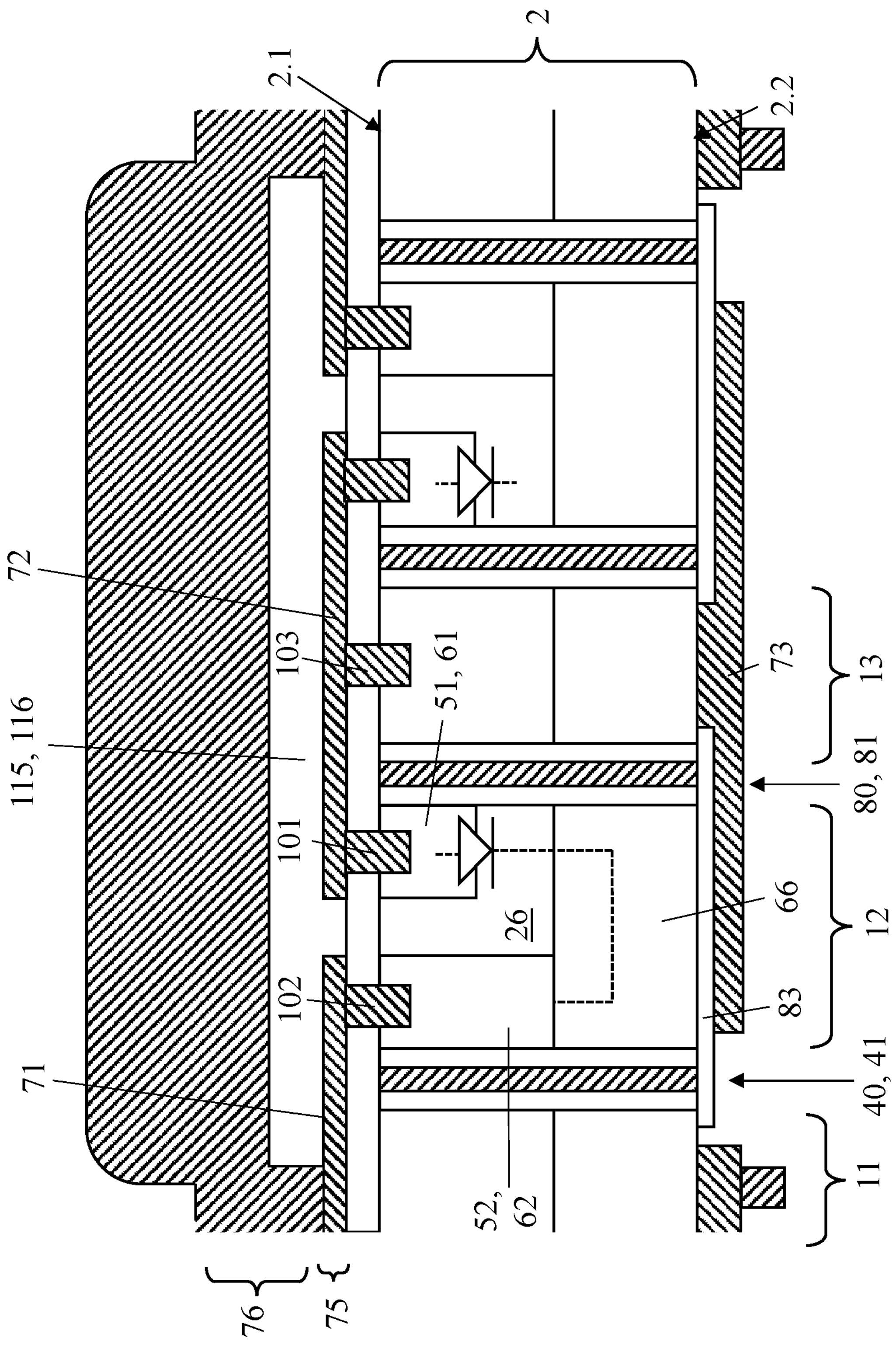
FIG. 7 shows a cross-section illustrating some manufacturing details.

FIG. 7 illustrates yet another embodiment, wherein the metallization structure on the second side 2.2 is comparable to the embodiments of FIGS. 3 and 4. However, the metallization on first side 2.1 differs. In the lower metallization layer 75, the first and second metal pad 71, 72 are formed. The frontside metallization layer 76 contacts the lower metallization layer 75 in the first area 11, like in the embodiments discussed so far, but extends further into the second and third area 12, 13. There, the frontside metallization layer 76 is electrically isolated from the second metal pad 72 by an insulating layer 115 which is an imide layer 116 in the example shown.

Figure 8:
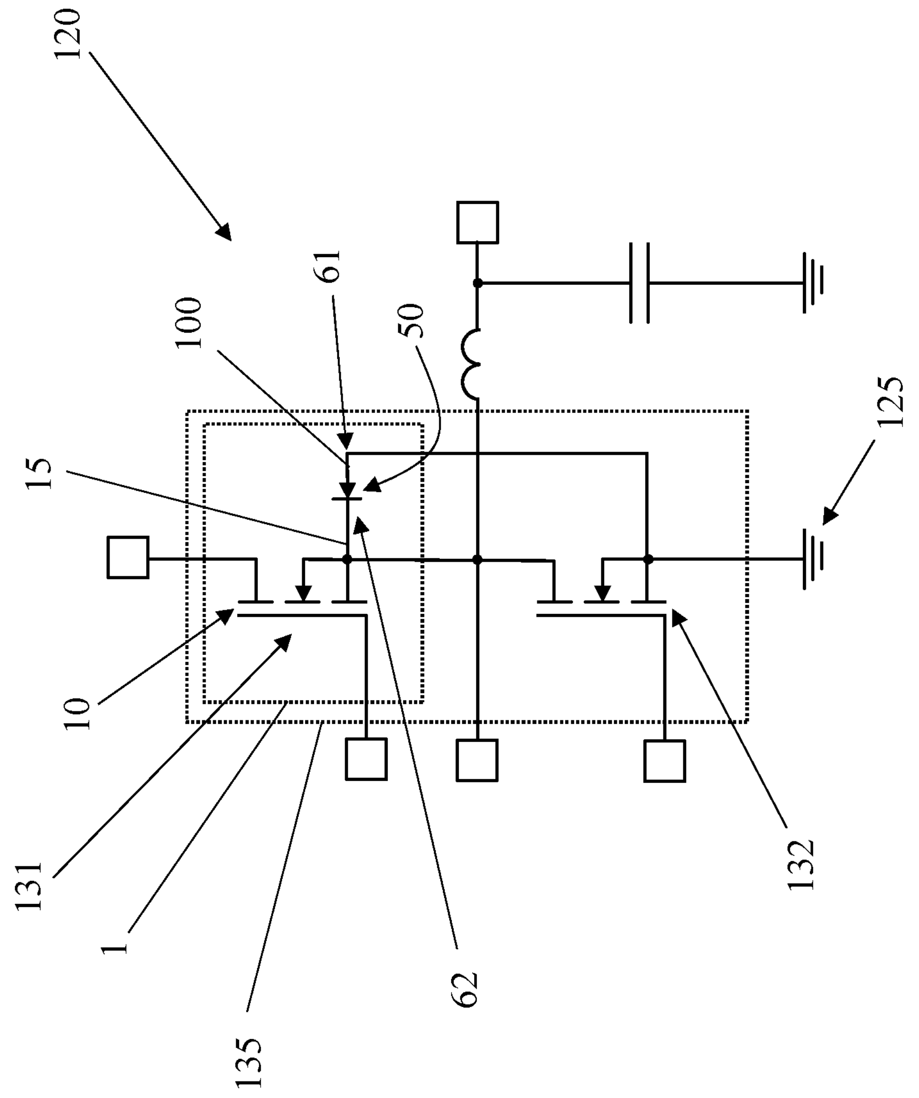
FIG. 8 shows a circuit diagram of a step-down converter.

FIG. 8 shows a circuit diagram of a step-down converter 120. It is a DC-to-DC converter to step down an input voltage $V_{in}$ to a lower output voltage $V_{out}$. The step-down converter 120 comprises a die 1 in a package 135, the die 1 comprising a vertical transistor device 10 and a monolithically integrated diode 50 as discussed above. The cathode contact 62 of the diode 50 is connected to the source of the vertical transistor device 10 (monolithically in the die 1, see above), and the anode contact 61 is connected to the ground domain 125. The vertical transistor device 10 is connected as a high side switch 131 between the load and the output, another transistor being connected as a low side switch 132 between the output and the ground domain 125. During a switching event, the diode 50 can provide an alternative current path between $V_{in}$ and ground, which can reduce parasitic inductances.

Figure 9:
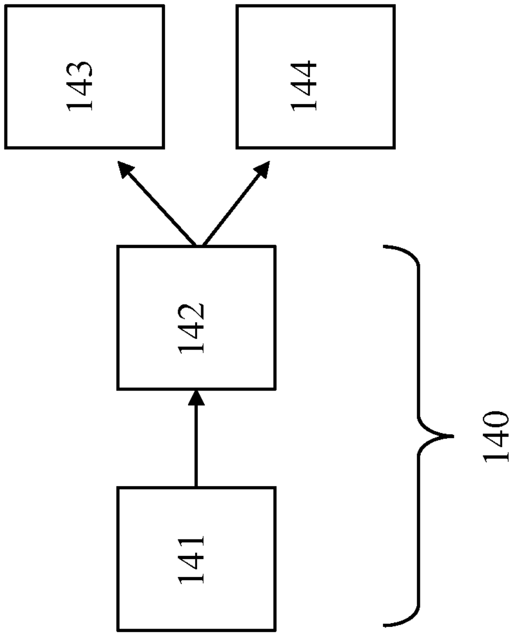
FIG. 9 shows a flow diagram that summarizes some manufacturing steps.

FIG. 9 summarizes some manufacturing steps in a flow diagram. A forming 140 of the first electrical isolation can for instance comprise a trench etch 141 and subsequent trench fill 142. A forming 143 of the vertical transistor device and a forming 144 of the diode can at least to some extent be done simultaneously, see for instance the remarks on FIGS. 5 and 6.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The expression "and/or" should be interpreted to cover all possible conjunctive and disjunctive combinations, unless expressly noted otherwise. For example, the expression "A and/or B" should be interpreted to mean only A, only B, or both A and B. The expression "at least one of" should be interpreted in the same manner as "and/or", unless expressly noted otherwise. For example, the expression "at least one of A and B" should be interpreted to mean only A, only B, or both A and B.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor die with a semiconductor body, the semiconductor die comprising:
- a vertical transistor device formed in a first area of the semiconductor body, the vertical transistor device comprising:
  - a source region at a first side of the semiconductor body, and
  - a drain region at a second side of the semiconductor body;
- a first electrical isolation between the first area and a second area of the semiconductor body; and
- a diode in the second area of the semiconductor body,
- wherein a cathode contact of the diode is electrically connected to the source region of the vertical transistor device.

2. The semiconductor die of claim 1, wherein the source region is connected to a first metal pad, and wherein an anode contact of the diode is connected to a second metal pad that is electrically isolated from the first metal pad.

3. The semiconductor die of claim 1, further comprising:
- a first doping region arranged in the second area at the first side of the semiconductor body, the first doping region forming an anode contact of the diode; and
- a second doping region arranged in the second area at the first side of the semiconductor body, the second doping region forming the cathode contact of the diode,
- wherein the diode is formed between the first doping region and a lower portion of the semiconductor body below the first doping region, and
- wherein the lower portion is electrically connected to the source region via the second doping region.

4. The semiconductor die of claim 3, wherein the source region is connected to a first metal pad, wherein an anode contact of the diode is connected to a second metal pad that is electrically isolated from the first metal pad, and wherein the electrical connection between the second doping region and the source region is formed by the first metal pad extending across the first electrical isolation formed in the semiconductor body.

5. The semiconductor die of claim 3, wherein a low-doped region made of an opposite doping type than the first doping region is laterally disposed between the first doping region and the second doping region.

6. The semiconductor die of claim 5, wherein the low-doped region is of a same doping type as a drift region of the vertical transistor device, and wherein the low-doped region comprises a similar doping profile as the drift region.

7. The semiconductor die of claim 3, further comprising:
- a high-doped region disposed below the second doping region in the second area at the second side of the semiconductor body, the high-doped region having a same doping type and profile as the drain region of the vertical transistor device.

8. The semiconductor die of claim 1 further comprising:

a fourth metallization pad in the second area on the second side of the semiconductor body and in electrical contact with the second side of the semiconductor body.

9. The semiconductor die of claim 1, further comprising:

a second electrical isolation formed between the second area and a third area of the semiconductor body, wherein an anode contact of the diode is electrically connected to the second side of the semiconductor body in the third area.

10. The semiconductor die of claim 9, wherein the source region is connected to a first metal pad, wherein an anode contact of the diode is connected to a second metal pad that is electrically isolated from the first metal pad, and wherein the anode contact of the diode is electrically connected to the second side of the semiconductor body via the second metal pad extending across the second electrical isolation.

11. The semiconductor die of claim 9, wherein the source region is connected to a first metal pad, wherein an anode contact of the diode is connected to a second metal pad that is electrically isolated from the first metal pad, wherein the second metal pad which extends across the second electrical isolation, and wherein the first metal pad and the second metal pad are formed in a same metallization layer and covered by a frontside metallization layer.

12. The semiconductor die of claim 9, wherein a third metal pad is formed in the third area on the second side of the semiconductor body to contact the anode contact of the diode.

13. The semiconductor die of claim 12, wherein the third metal pad extends across the second electrical isolation into the second area of the semiconductor body.

14. The semiconductor die of claim 13, wherein the third metal pad is electrically isolated from the semiconductor body by an insulating material arranged on the second side of the semiconductor body, and wherein the insulating material is identical to an insulating material of an insulating filler of a deep trench isolation that forms the second electrical isolation between the second area and the third area.

15. The semiconductor die of claim 1, further comprising:

a first doping region arranged in the second area at the first side of the semiconductor body, and forming an anode contact of the diode, wherein the first doping region is of a same doping type and profile as a body region of the vertical transistor device.

16. The semiconductor die of claim 1, further comprising:

a first doping region arranged in the second area at the first side of the semiconductor body, and forming an anode contact of the diode, wherein the first doping region is arranged between trenches which are of a same type as gate trenches of the vertical transistor device.

17. The semiconductor die of claim 1, wherein the first doping region and the second doping region are made of a monocrystalline semiconductor material.

18. A semiconductor package comprising the semiconductor die of claim 1, wherein an anode contact of the diode is electrically connected to a ground contact of the semiconductor package.

19. A step-down converter comprising the semiconductor die of claim 1, wherein the vertical transistor device is connected as a high-side switch, and wherein an anode contact of the diode is connected to a ground domain.

20. A method of manufacturing a semiconductor die with a semiconductor body, the method comprising:

forming a vertical transistor device in a first area of the semiconductor body, the vertical transistor device comprising a source region at a first side of the semiconductor body and a drain region at a second side of the semiconductor body;

forming a first electrical isolation between the first area and a second area of the semiconductor body;

forming a diode in the second area of the semiconductor body; and electrically connecting a cathode contact of the diode to the source region of the vertical transistor device.

* * * * *